US 8,450,861 B2

(12) United States Patent
Otremba

(10) Patent No.: US 8,450,861 B2
(45) Date of Patent: May 28, 2013

(54) INTEGRATED CIRCUIT DEVICE WITH SEMICONDUCTOR DEVICE COMPONENTS EMBEDDED IN PLASTIC HOUSING COMPOSITION

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 1048 days.

(21) Appl. No.: 11/747,585

(22) Filed: May 11, 2007

(65) Prior Publication Data

US 2007/0262432 A1 Nov. 15, 2007

(30) Foreign Application Priority Data

May 11, 2006 (DE) .......................... 10 2006 022 254

(51) Int. Cl.
*H01L 23/29* (2006.01)
(52) U.S. Cl.
USPC .................................. 257/790; 257/E23.127
(58) Field of Classification Search
USPC .................. 257/E23.127, 701–703, 706–707, 257/790, 753
See application file for complete search history.

(56) References Cited

U.S. PATENT DOCUMENTS

| 4,494,217 A * | 1/1985 | Suzuki et al. ................ 257/660 |
| 4,677,741 A * | 7/1987 | Takahama ............. 257/E23.125 |
| 4,997,516 A * | 3/1991 | Adler ........................... 216/101 |
| 5,582,772 A | 12/1996 | Kwak |
| 6,140,150 A * | 10/2000 | Efland et al. ................ 438/106 |
| 6,284,570 B1 * | 9/2001 | Betran et al. ................ 438/112 |
| 6,770,971 B2 | 8/2004 | Kouno et al. |
| 7,049,683 B1 * | 5/2006 | Sirinorakul et al. .. 257/E23.127 |
| 2002/0056903 A1 | 5/2002 | Li et al. |
| 2004/0207056 A1 * | 10/2004 | Seki et al. ..................... 257/676 |

FOREIGN PATENT DOCUMENTS

| DE | 102004047510 | 4/2006 |
| JP | 2001210776 | 8/2001 |
| WO | 0074131 | 12/2000 |

OTHER PUBLICATIONS

Lee et al., Failure paths at copper-base leadframe/epoxy molding compound interfaces, Journal of Materials Science, 2002, 37, pp. 4247-4257, Kluwer Academic Publishers.
Cho et al., The Effect of the Oxidation of Cu-Base Leadframe on the Interface Adhesion Between Cu Metal and Epoxy Molding Compound, IEEE Transactions on Components, Packaging, and Manufacturing Technology-Part B, vol. 20, No. 2, May 1997, pp. 167-175.
Cho et al., Effect of the microstructure of copper oxide on the adhesion behavior of epoxy/copper leadframe joints, J. Adhesion Sci. Technol., vol. 14, No. 11, 2000, pp. 1333-1353.

* cited by examiner

*Primary Examiner* — Matthew Landau
*Assistant Examiner* — Sun M. Kim
(74) *Attorney, Agent, or Firm* — Dicke, Billig & Czaja, PLLC

(57) ABSTRACT

The invention relates to a semiconductor device comprising semiconductor device components embedded in plastic housing composition. The semiconductor device components partly contain copper or have copper-containing coatings and/or coating structures. The copper-containing regions of the semiconductor device components have an adhesion promoting layer with copper(II) oxide whiskers on the surfaces that are in contact with the plastic housing composition.

26 Claims, 6 Drawing Sheets

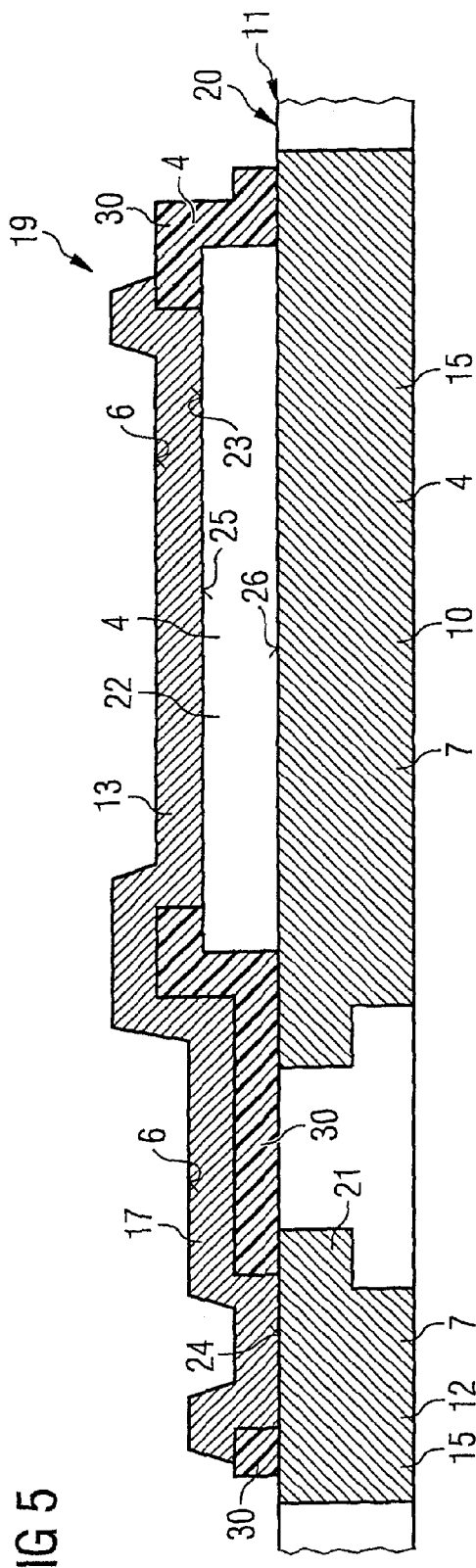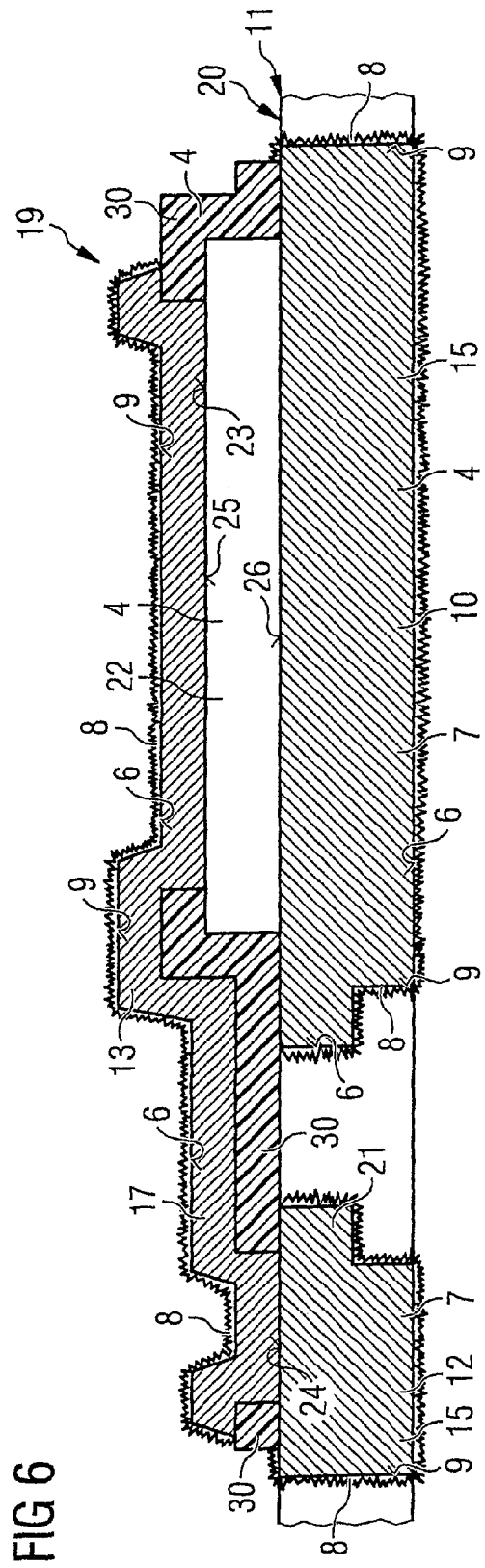

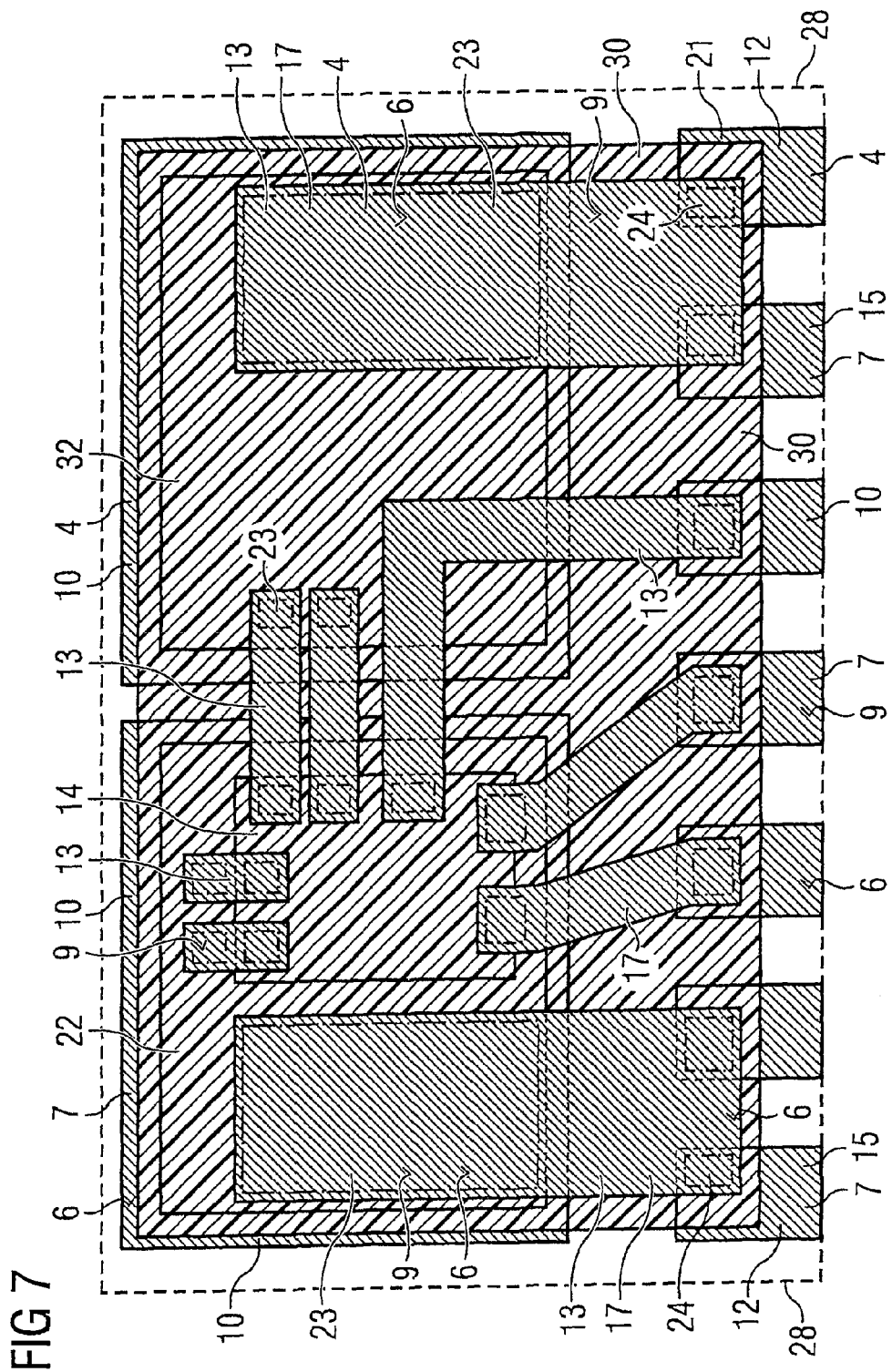

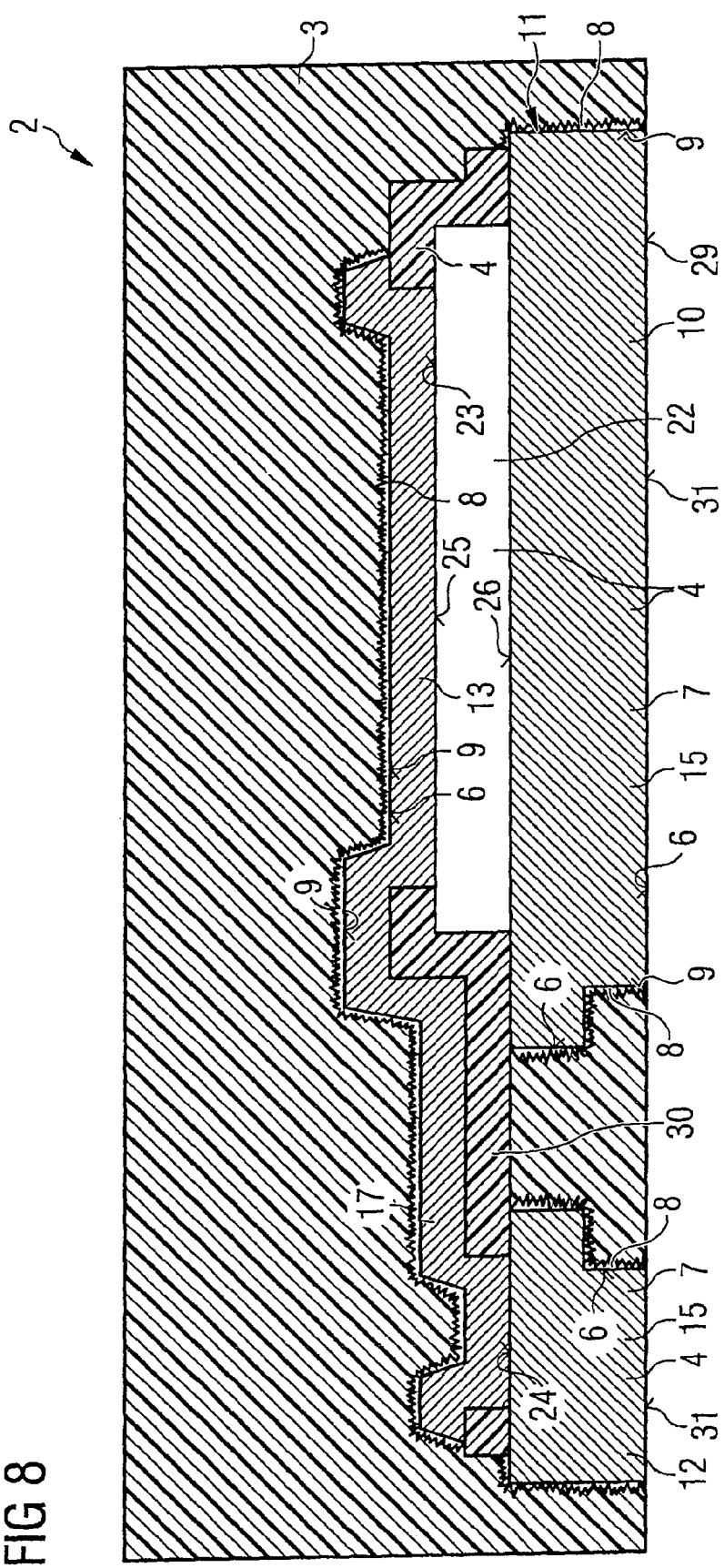

INTEGRATED CIRCUIT DEVICE WITH SEMICONDUCTOR DEVICE COMPONENTS EMBEDDED IN PLASTIC HOUSING COMPOSITION

CROSS-REFERENCE TO RELATED APPLICATIONS

This Utility Patent Application claims priority to German Application No. DE 10 2006 022 254.7, filed May 11, 2006, which is herein incorporated by reference.

BACKGROUND

In the case of semiconductor devices, a lack of adhesion between a system carrier and the plastic housing composition has the effect that moisture accumulates in the boundary layer between system carrier and plastic housing composition. The moisture expands abruptly if the semiconductor device is heated from room temperature to temperatures of up to 260° C. in a very short time during soldering onto a printed circuit board. The consequence of the abrupt expansion of the moisture content is cracks and/or fractures in the plastic housing of the semiconductor device, which is referred to as the "popcorn effect".

In order to prevent this popcorn effect, it is necessary to prevent the accumulation of moisture in the boundary layer between semiconductor device components and plastic housing composition. The accumulation of moisture can be reduced by improving the adhesion between the surfaces of the semiconductor device components and the surface of the plastic housing composition. Various approaches are known for improving the adhesion. U.S. Pat. No. 5,554,569 discloses a method for mechanically roughening the surface of a leadframe. The roughened surface enables an intermeshing with the plastic housing composition and consequently a better adhesion. However, this method is cost-intensive and difficult to carry out.

In the document H. Y. Lee et al. "Failure paths at copper-base leadframe/epoxy moulding compound interfaces", Journal of Material Science 37, 2002, pages 4247 to 4257, copper (II)oxide and copper(I)oxide layers are produced in a hot sodium hydroxide solution on leadframes made of copper and their adhesion promoting properties with respect to a plastic housing composition are investigated, transference to the practical fabrication of semiconductor devices not being unproblematic since here the adhesion promoting layer is based on wet-chemical techniques, which does not reduce the risk of moisture inclusions.

In the document Kilwon Cho et al. "Effect of the microstructure of copper oxide on the adhesion behaviour of epoxy/copper leadframe joints", J. Adhesion Sci. Technol., Vol. 14, pages 1333 to 1353, (2000), laminae made of copper are thermally oxidized and copper(II)oxide and copper(I)oxide layers are produced and their adhesion promoting properties with respect to a plastic housing composition are investigated. It is pointed here that with increasing thermal oxidation, a conversion from copper(I)oxide to copper(II)oxide takes place and this conversion enables adhesion promotion with respect to a plastic housing composition, which has been problematic hitherto in the case of pure copper surfaces and/or in the case of surfaces with a copper(I)oxide layer, for which reason leadframes made of an iron-nickel alloy including 42% by weight nickel have been used hitherto, the thermal oxides of which ensure the adhesion to a plastic housing composition in an improved fashion.

There is a need, however, in the further development of the semiconductor devices, to increase the interface stability and the adhesiveness between the widespread plastic housing composition made of filled epoxy resins and the leadframe in order to improve the service life and the reliability of the semiconductor devices, and at the same time to minimize the costs, especially as the alloy costs of the iron-nickel leadframes are relatively high. Moreover, there is a need to improve the electrical conductivity of the leadframes with respect to iron-nickel leadframes. However, the thermal copper(I)oxides are known as a weak point in the embedding of semiconductor device components into a plastic housing composition. A further disadvantage is that thermal copper oxides on the leads of a copper leadframe impede a bonding connection.

SUMMARY

In accordance with exemplary embodiments of the invention, an integrated circuit device includes a system carrier and further semiconductor device components embedded into a plastic housing composition. The semiconductor device components include at least one semiconductor chip arranged on a chip carrier of the system carrier and connecting elements, wherein the system carrier and further semiconductor device components have copper containing regions, and wherein the copper containing regions have an adhesion promoting layer with copper(II)oxide whiskers on the surfaces that are in contact with the plastic housing composition.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Embodiments of the invention will now be explained in more detail with reference to the accompanying figures.

FIG. 1 illustrates a schematic cross section through a system carrier with semiconductor chip and connecting elements.

FIG. 2 illustrates a schematic cross section through the system carrier from FIG. 1, after the application of an adhesion promoting layer.

FIG. 3 illustrates a plan view of a system carrier in a semiconductor chip position.

FIG. 4 illustrates a schematic cross section through a signal-processing semiconductor device in accordance with a first embodiment of the invention.

FIGS. 5 to 8 illustrate cross sections of semiconductor device components during the production of a power semiconductor device.

FIG. 5 illustrates a schematic cross section through a system carrier with positioned power semiconductor chip and applied connecting element.

FIG. 6 illustrates a schematic cross section through the system carrier in accordance with FIG. 5 after the application of an adhesion promoting layer.

FIG. 7 illustrates a plan view of a system carrier of the power semiconductor device.

FIG. 8 illustrates a schematic cross section through a power semiconductor device in accordance with a second embodiment of the invention.

DETAILED DESCRIPTION

Figure 1:
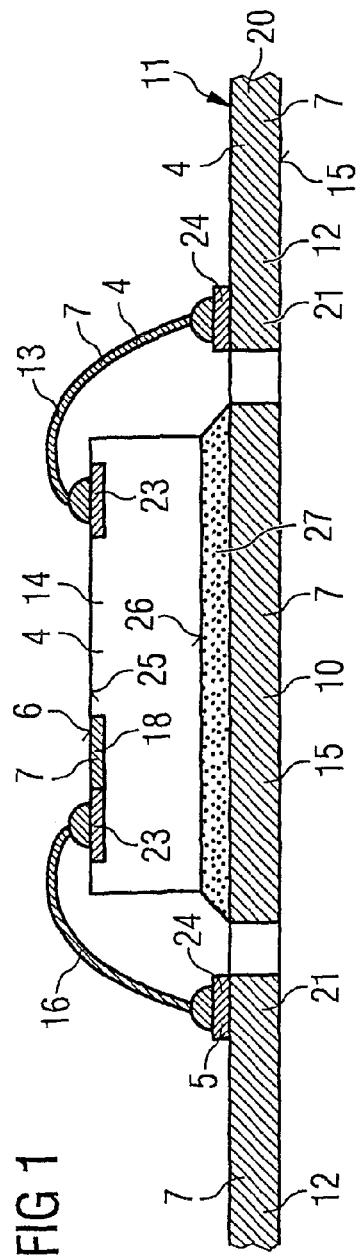
FIGS. 1 to 4 illustrate views of semiconductor device components during the production of a signal-processing semiconductor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In accordance with certain aspects of the invention, an integrated circuit device includes semiconductor device components embedded in plastic housing composition, wherein the semiconductor device components include at least one system carrier, at least one semiconductor chip arranged on a chip carrier of the system carrier, and connecting elements. The semiconductor device components in each case have copper-containing regions, where copper-containing regions are understood also to mean regions with copper-containing coatings and/or coating structures. The copper-containing regions of the system carrier and of further semiconductor device components are covered by an adhesion promoting layer with copper(II)oxide whiskers on the surfaces that are in contact with the plastic housing composition.

A semiconductor device of this type has the advantage that the plastic housing composition is intensively intermeshed with the thermally grown copper(II)oxide whiskers of the surfaces of semiconductor device components. The whiskers can be grown thermally or be produced wet-chemically. Thermally grown whiskers have the advantage that they have no moisture whatsoever. Moreover, these semiconductor devices have the advantage that the dry thermal joining processes required for bonding or for diffusion soldering can also be used for the production of the adhesion promoting layer. Consequently, no costly and additional semiconductor-technological installations are required in order to provide a reliable adhesion between the plastic housing composition and copper-containing surfaces of the semiconductor device components of a semiconductor device.

Finally, these acicular crystals in the form of whiskers of copper(II)oxide can cover all the semiconductor device components of a semiconductor device which either themselves include a copper alloy or have a copper coating or a coating structure made of a copper alloy. Since not only the system carriers of a semiconductor device have copper coatings and copper structures but also the semiconductor chips themselves increasingly have copper interconnects instead of aluminium interconnects on their top side, and the bonding wire technology is also increasingly being switched to copper instead of gold or aluminium wires, the provision of a thermally grown adhesion promoting layer having copper(II)oxide whiskers is an advantageous prospect in comparison with the known adhesion promoting layers that have hitherto been applied by special methods such as electrodeposition and/or wet-chemical deposition.

The invention is not just restricted to the improvement of the adhesion between a system carrier and a plastic housing composition, but rather improves the adhesion of all copper-containing semiconductor device components of a semiconductor device. What is more, the subject matter of the present invention has the advantage that the plastic housing composition now reliably ensures the mechanical cohesion of the semiconductor device on account of the intimate mechanical connection to the various semiconductor device components.

In one embodiment of the invention, the adhesion promoting layer has copper(II)oxide whiskers having a thickness d of between $1 \text{ nm} \leq d \leq 50 \text{ nm}$, between $3 \text{ nm} \leq d \leq 20 \text{ nm}$ in certain embodiments. Such filigree, acicular crystals made of CuO form feltlike layers which grow from a copper(I)oxide layer that initially arises during the oxidation of the copper-containing surfaces. This gives rise to nanocopper(II)oxide whiskers having an average length l of between $5 \text{ nm} \leq l \leq 300 \text{ nm}$, between $10 \text{ nm} \leq l \leq -100 \text{ nm}$ in certain embodiments. Such lengths l are optimal for the formation of an adhesion promoting layer since they extend over hundreds of molecular layers of the acicular crystals. Depending on the degree of restructuring from copper(I)oxide to copper(II)oxide, the adhesion promoting layer has two layers, wherein the first layer essentially has copper(I)oxide as boundary layer with respect to copper-containing surfaces and a second layer adjoining it has copper(II)oxide whiskers as boundary layer with respect to the plastic housing composition.

Consequently, the adhesion promoting layer undergoes transition from a whisker-free coating on the surface of the copper-containing semiconductor device components to a layer containing copper(II)oxide whiskers in the transition region with respect to the plastic housing composition. The layer containing copper(II)oxide whiskers can be adhesively mixed with the conventional plastic housing compositions made of an epoxy resin. A polyimide plastic can also be used as plastic housing composition and has an improved adhesion to the surfaces of the semiconductor device components if such a transition layer containing copper(II)oxide whiskers has been formed beforehand. In this case, it is also not troublesome if the plastic housing composition, as in most cases, has a ceramic filling material. Plastic housing compositions of this type are very widespread and manifest problems if they are intended to be applied to pure copper-containing top sides of semiconductor device components. It has been established here that conventional plastic housing compositions of this type with ceramic particles as filling material do not adhere adequately on the smooth top side of copper conductors or copper leads of copper leadframes, with the result that there is a risk of delamination if semiconductor device components have not been improved by a suitable adhesion promoting layer. In order to improve the adhesion promotion, the plastic housing composition may also have copper(II)oxide.

It is also if the semiconductor device has a copper-containing and/or copper-coated semiconductor chip carrier as semiconductor device component. Semiconductor chip carriers of this type serve for holding the semiconductor chip fixed on them in position until corresponding connecting elements connect contact areas on the top sides of the semiconductor chip to contact pads on corresponding leads.

Alongside the system carrier made of a leadframe with leads and semiconductor chip carrier, the semiconductor device has copper-containing connecting elements between a semiconductor chip and external contacts of the semiconductor device as semiconductor device component. For this technology according to the invention, such connecting elements are copper-containing or copper-coated bonding wires, bonding strips or bonding tapes. Since the bonding wires, bonding strips or bonding tapes are likewise fitted thermally, the application of a specific adhesion promoting layer can also be provided in the context of such a thermal bonding method.

Finally, it is furthermore possible to utilize the copper-containing interconnects of a semiconductor chip in order to achieve an intensive intermeshing with the surrounding plastic housing composition also in the region of the top sides of the semiconductor chip. For this purpose, suitable semiconductor chips have copper-containing interconnects whose surfaces are in contact with the plastic housing composition.

A system carrier for a plurality of semiconductor devices including a plurality of semiconductor device positions that are arranged in rows and/or columns one after another and/or one behind another has the following features. For the purpose of receiving semiconductor device components, this system carrier has a chip carrier and lead ends that are intended to be arranged within the plastic housing. Semiconductor chips are diffusion-soldered on the chip carriers and the lead ends are electrically connected to the semiconductor chips on the chip carrier by using diffusion-soldered or thermocompression-bonded connecting elements. All of the copper-containing regions near the surface of the leadframe, of the connecting elements and of the semiconductor chips have the adhesion promoting layer according to the invention with copper(II)oxide whiskers, such that with correspondingly prepared adhesion promoting layers, a system carrier of this type has the advantages already mentioned above.

Semiconductor chips, such as a plurality of signal-processing logic and memory semiconductor chips are arranged on the system carrier. A multiplicity of bonding connects arise in such a case, such that for an intimate mechanical connection between the bonding wire connections and the surrounding plastic housing composition, the bonding wires are produced from copper or have a copper-containing coating.

A system carrier is configured quite differently if it is provided for a plurality of power semiconductor chips. Here it is a matter of connecting large-area contact areas of the semiconductor chips to correspondingly large-area connecting elements and finally embedding the whole securely into a plastic housing composition. In this case, it is advantageous if here as well the connecting elements, which include a large area, are produced from copper-containing material, so that an adhesion promoting layer can be formed thermally by oxidization on the copper-containing surfaces without any problems. The further boundary conditions, such as the length of the copper(II)oxide whiskers and the thickness of the copper(II)oxide whiskers, can be implemented unchanged in the ranges specified above both for the power semiconductor devices and for the logic and/or memory semiconductor chips.

The structure of the adhesion promoting layer with involvement of copper(I)oxide in the region near the surface of the copper-containing surfaces and with the increasing portion of copper(II)oxide in the form of whiskers is also advantageous for the system carrier. This is because as soon as the system carrier has all the semiconductor device components required for a semiconductor device, the outlay for providing whisker-free surfaces is no longer necessary.

In order, then, to create the semiconductor devices according to the invention from a system carrier equipped with semiconductor chips and connecting elements, after the application of the adhesion promoting layer to all the copper-containing surfaces, it is merely necessary for the semiconductor device positions of the system carrier to be packaged into a plastic housing composition, the system carrier subsequently being separated into individual semiconductor devices. In order to produce a system carrier of this type, a substrate plate, which has at least partly a copper-containing metal surface, is structured. For this purpose, a copper alloy plate may be used as substrate plate.

For the structuring of a copper alloy plate to form a system carrier, stamping installations are appropriate, which can produce large numbers of items in short production times. Instead of a pure copper alloy plate, a copper-coated plate, for example made of plastic or a glass-fibre-reinforced plastic or else made of ceramic, may also be used as substrate plate. Ceramic plates that are partly copper-coated and are intended to serve as system carrier are produced using sintering technology, these sintering techniques also making it possible to provide multilayer system carriers. The most widespread system carrier is the leadframe, however, which includes outer leads, which form the external contacts of the semiconductor device, and inner lead ends, which carry contact pads, and can be connected to contact areas of the semiconductor chip by using connecting elements.

Leadframes of this type, as already mentioned above, have hitherto been made of a relatively expensive iron/nickel alloy including 42% by weight nickel. Although these iron/nickel leadframes have the advantage that they have a high adhesion to the surrounding plastic housing composition, they are a heat loss factor for modern semiconductor devices, in particular for power semiconductor devices, on account of their high resistivity.

In one exemplary implementation of the method, during the positioning of the semiconductor chips in the semiconductor device positions, the semiconductor chips are diffusion-soldered on the chip carriers and the system carrier with the positioned semiconductor chips is subsequently thermally oxidized. This is advantageous when the semiconductor chip has flip-chip contacts and the flip-chip contacts can be connected directly on a chip carrier. In that case, the connection of the flip-chip contacts is already concluded with the fitting of the semiconductor chip on the chip carrier, such that the oxidation of copper-containing surfaces with formation of copper(II)oxide whiskers can begin immediately.

If provision is made, however, for using a semiconductor chip which does not have flip-chip contacts, then it is advantageous to thermally oxidize—only after the fitting of connecting elements—the system carrier with the positioned semiconductor chips and the mounted connecting elements, especially as a cohesively and electrically conductive connection of connecting elements on already oxidized copper-containing surfaces poses problems.

A method for producing a plurality of semiconductor devices involves producing a system carrier for a plurality of semiconductor devices with positioned semiconductor chips and mounted connecting elements, and also with copper(II) oxide whiskers on copper-containing metal surfaces. The semiconductor device components in the semiconductor device positions are then embedded into a plastic housing composition with intermeshing of the plastic housing composition with the copper(II)oxide whiskers of the adhesion promoting layer. Finally, separation of the system carrier into individual semiconductor devices may follow. For this purpose, surface regions that are to be kept free of the adhesion promoting layer are either to be covered previously with a protective layer before the oxidation is carried out, or, after the application of the plastic housing composition, for example the oxidized surface regions for external contacts that are to be kept free of the adhesion promoting layer are chemically reduced or mechanically polished and removed, thereby re-establishing direct access to the metallically conductive surfaces of the external contacts.

The production of the adhesion promoting layer can be inserted, in principle, between each of the fabrication steps for producing a semiconductor device. However, if all of the available copper-containing surfaces are intended to be provided with a corresponding adhesion promoting layer made of a CuO with correspondingly formed whiskers, then it is advantageous for this oxidation process not to be effected until shortly before the application of the plastic housing composition. It is also possible, however, firstly to apply the adhesion promoting layer and only afterwards to equip the system carrier with the semiconductor chips and/or to fit the connecting elements. This method variant may be chosen for example if a wet-chemical application of the adhesion promoting layer is provided.

FIGS. 1 to 4 illustrate views of semiconductor device components 4 during the production of a signal-processing integrated circuit device 1. Components having identical functions are identified by identical reference symbols in FIGS. 1 to 4 below and are not discussed repeatedly.

FIG. 1 illustrates a schematic cross section through a system carrier 20 in the form of a leadframe 11 with a semiconductor chip 14 and connecting elements 13 in the form of bonding wires 16. The bonding wires 16 connect copper-containing contact areas 23 on the top side 25 of the semiconductor chip 14, which has a signal-processing integrated circuit, to contact pads 24 on lead ends 21 of the leads 12 of the leadframe 11. For receiving and fixing the bonding wire 16, the lead end 21 has a copper-containing coating 5 for the contact pad 24. The leadframe 11 with its leads 12 and with the chip carrier 10 is also produced from a copper alloy having for example 0.3% by weight Cr, 0.25% by weight Sn and 0.2% by weight Zn as alloying elements.

The bonding wire 16 may have a gold- or aluminium-containing core covered by a copper-containing coating. Furthermore, interconnects 18 are provided on the top side 25 of the semiconductor chip 14, and connect the contact areas 23 to corresponding semiconductor devices of the signal-processing integrated circuit of the semiconductor chip 14. In this embodiment of the invention, the interconnects 18 also contain copper and are not covered by a passivation layer, so that they can also contribute to improving an adhesion between the semiconductor device components 4 and a plastic housing composition that embeds the semiconductor device components.

In preparation for the subsequent processes for the application of an adhesion promoting layer to the copper-containing regions 7 of the semiconductor device components 4, in this embodiment of the invention the semiconductor chip 14 is connected by its rear side 26 to the chip carrier 10 of the leadframe 11 by a diffusion solder layer 27 based on AuSi, AuSn, AgSn, CuSn and/or AgIn. Such a diffusion solder layer 27 is extremely thermostable, so that the fixing of the semiconductor chip 14 on the chip carrier 10 is also maintained during the subsequent thermal application of an adhesion promoting layer to the copper-containing regions 7 of the semiconductor device components 4.

Figure 2:
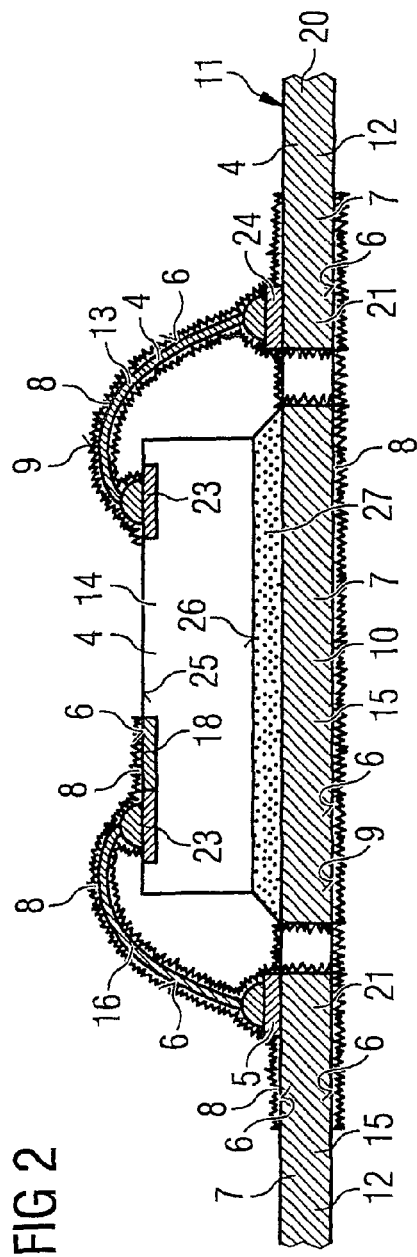

FIG. 2 illustrates a schematic cross section through the system carrier 20 in accordance with FIG. 1, with the semiconductor chip 14 on the chip carrier 10 and connecting elements 13 from the semiconductor chip 14 to lead ends 21 after the application of an adhesion promoting layer 8. The adhesion promoting layer 8 arises thermally on all copper-containing surfaces 6, with the result that, in this exemplary embodiment of the invention, as many as possible of the surfaces 9 that come into contact with the plastic housing composition and have a copper-containing coating 5 or constitute a copper alloy themselves are intensively adhesively and mechanically connected. In order to apply the adhesion promoting layer 8, firstly the surfaces, that is to say the semiconductor device components 4 illustrated in FIG. 1, are degreased in a solution including dichloromethane and are washed with acetone. Natural oxides that have formed on the surfaces can be etched away by using a 5% by weight $H_2SO_4$ sulphuric acid solution.

The top sides are then exposed to a thermal oxidation by heating the system carriers 20 with fixed semiconductor chips 14 and connecting elements 13 as semiconductor device components 4 to an oxidation temperature of between 150° C. and 250° C., for example to a temperature of 175° C., in an oxygen atmosphere for a time of 5 to 120 minutes, between 10 and 30 minutes in certain embodiments. In this case, in a first phase, a copper(I)oxide layer can form directly on the copper-containing surfaces, but acicular or hair-like copper(II)oxide whiskers grow from the layer after a short time. In this case, the adhesion promoting layer 8 typically undergoes transition from a whisker-free coating directly on the surfaces 6 of the copper-containing semiconductor device component 4 to a layer containing copper(II)oxide whiskers in the transition region with respect to the plastic housing composition 3, such that the adhesion promoting layer 8 has two layers. Depending on the oxidation duration, copper(II)oxide whiskers of this type can attain a length l of between $5 \text{ nm} \leq l \leq 300 \text{ nm}$, between $10 \text{ nm} \leq l \leq 100 \text{ nm}$ in exemplary embodiments, that is to say form nanoscale structures.

Synchronously with the length l, the thickness d also increases and is between $1 \text{ nm} \leq d \leq 50 \text{ nm}$, between $3 \text{ nm} \leq d \leq 20 \text{ nm}$ in certain embodiments. The growth direction of the copper(II)oxide whiskers varies, with the result that they form a feltlike coating significantly improving the adhesion to the plastic housing composition to be applied in comparison with adhesion of copper-containing surfaces to the plastic housing composition. With this adhesion promoting layer 8, it is possible to produce a mechanical intermeshing with the plastic housing composition to be applied such that the risk of delamination is reduced and, on account of the thermal oxidation taking place at above 100° C., there is also no risk of moisture absorption in this process.

Consequently, after the application and intermeshing of the plastic housing composition, the risk of a so-called "popcorn effect" occurring, as exists in the case of wet-chemical deposition of adhesion promoting layers, is now significantly reduced in the case of the adhesion promoting layer 8 according to the invention. In this case, FIG. 2 illustrates that not only the leadframe 11, which, in this embodiment of the invention, includes a copper-containing plate and has the adhesion promoting layer 8, but also the contact pads 24 on the lead ends 21, the contact areas 23 on the top side 25 of the semiconductor chip 14 and even the interconnects 18 on the top side 25 of the semiconductor chip 14, in so far as they contain copper, exhibit the adhesion promoting layer.

Figure 3:
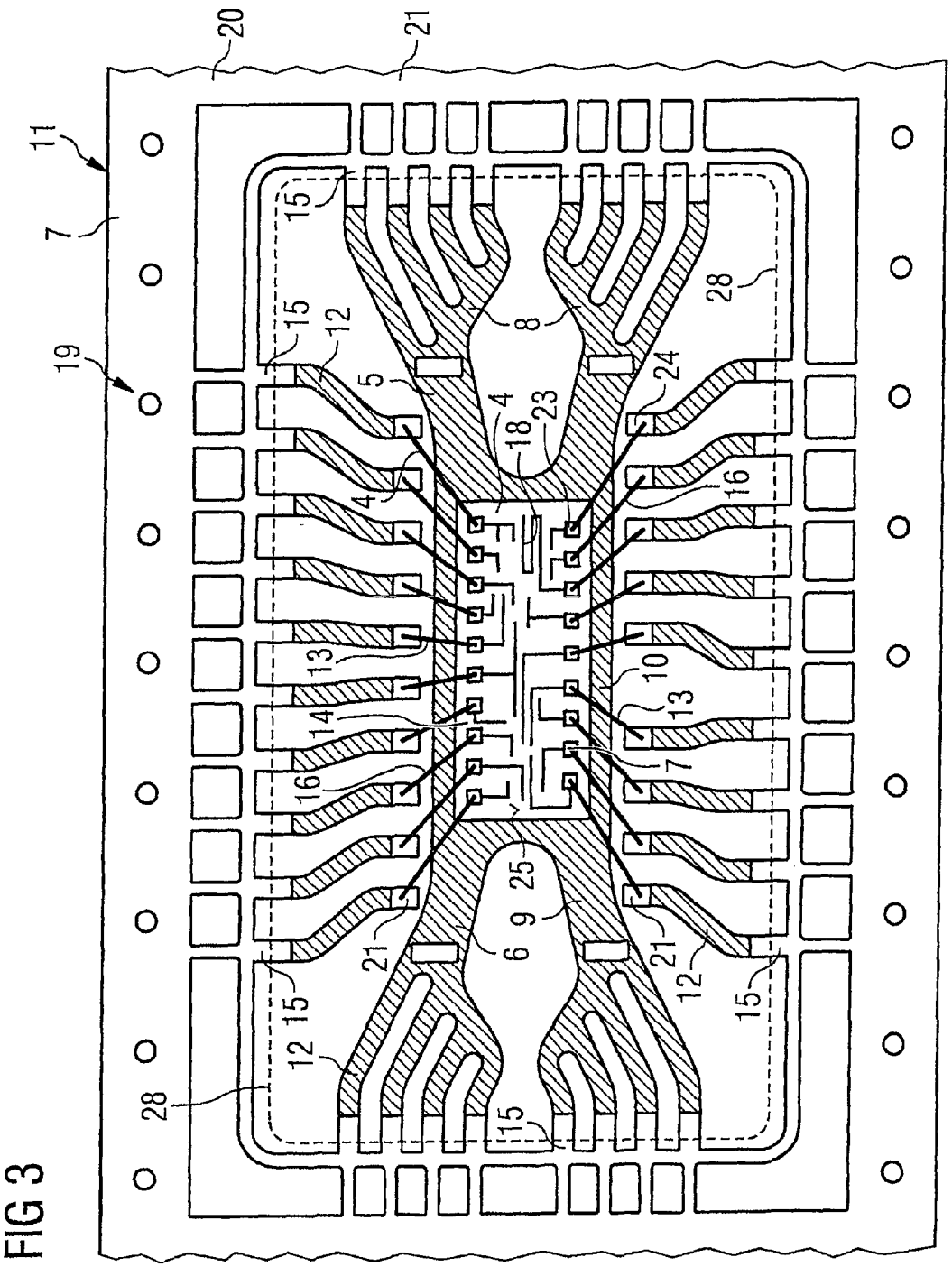

FIG. 3 illustrates a plan view of a system carrier 20 in a semiconductor device position 19 prior to the application of a plastic housing composition for the embedding of the semiconductor device components 4. The contour of the plastic housing is identified by a dashed line 28. It also corresponds approximately to the edging boundary of a cutting tool that stamps or cuts the finished semiconductor device, after application of the plastic housing composition, from the leadframe 11 in the semiconductor device position 19 of the system carrier 20.

In order to achieve an intensive intermeshing between the plastic housing composition to be applied and the semiconductor device components 4, not only are the hatched areas of the leadframe 11 oxidized to form an adhesion promoting layer 8, but also the copper-containing regions 7 on the top side 25 of the semiconductor chip 14 in the form of copper-containing interconnects 18, and also the copper-containing contact areas 23 and at least copper-coated bonding wires 16 are covered with copper(II)oxide whiskers. After the application of the plastic housing composition and stamping out of the semiconductor device from the semiconductor device position 19 of the leadframe 11, the stamped-out ends of the leads 12 on the edge sides of the semiconductor device form external contacts 15 that can be accessed externally.

Figure 4:
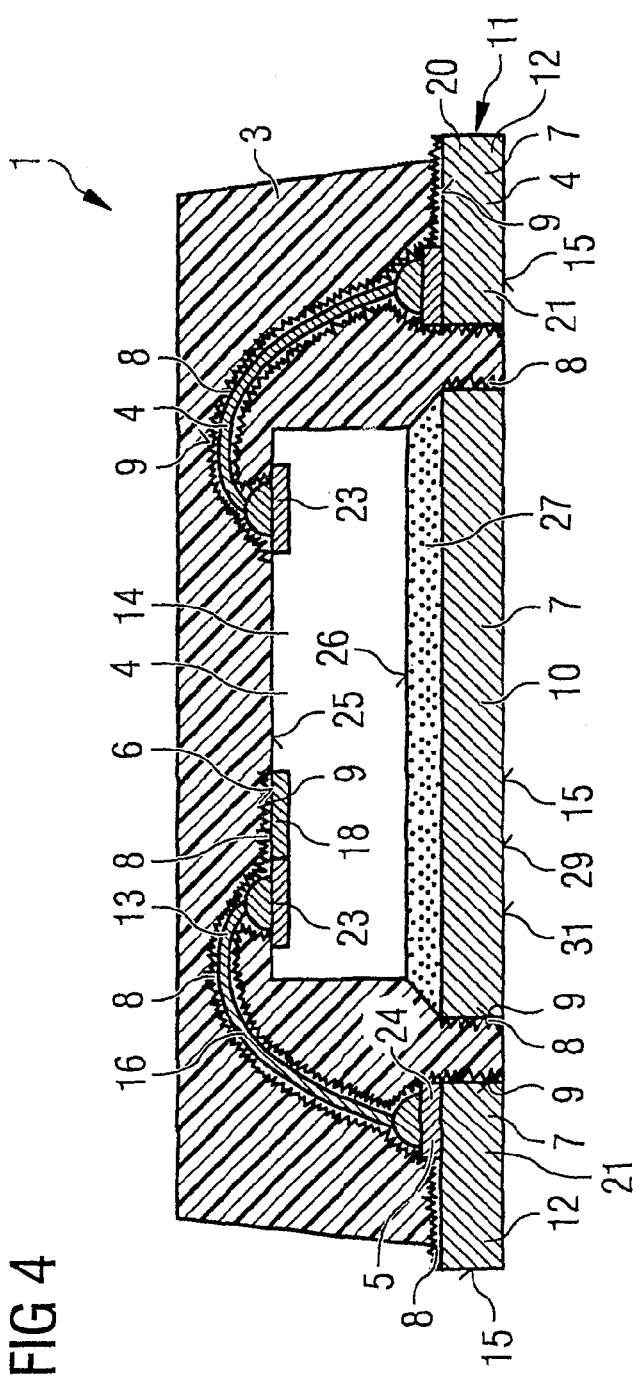

FIG. 4 illustrates a schematic cross section through a signal-processing semiconductor device 1, in accordance with a first embodiment of the invention. The construction including semiconductor device components 4 which are covered partly with copper(II)oxide whiskers as adhesion-enhancing layer 8, as illustrated in FIG. 2, is now embedded into a plastic housing composition 3 with the aid of a moulding process whilst leaving free external contacts 15 on the underside 29 of the semiconductor device 1. In the case of this semiconductor device, the CuO layer illustrated on the underside of the leadframe 11 in FIG. 2 has been removed subsequently, that is to say after the embedding into the plastic housing composition, in order to ensure a low-impedance access to the components of the semiconductor device 1 from the external contact areas 15 on the underside 29 of the semiconductor device 1. The external contacts 15 arranged on the edge sides of the semiconductor device 1 already arise as a result of the stamping process and therefore do not have to be freed of an adhesion promoting layer.

The mounting process implementation according to the invention enables an adhesion enhancement and at the same time a reduction of costs since the required copper(II)oxide whiskers can be produced during the standard semiconductor processes such as e.g., the thermal processes during the application of the semiconductor chip to the chip carrier or during the bonding wire connecting method and, in addition, the customary Ag or Ni coatings of a copper leadframe are obviated, especially as, for a diffusion solder process, diffusion solder materials such as AuSi, AuSn, AgSn, CuSn, or AgIn are intended to be utilized for the cohesive chip connection to the chip carrier 10 in this embodiment of the invention.

FIGS. 5 to 8 illustrate schematic views of semiconductor device components 4 during the production of a power semiconductor device 2. Components having the same functions as in the previous figures are identified by the same reference symbols in FIGS. 5 to 8 and are not discussed separately.

FIG. 5 illustrates a schematic cross section through a system carrier 20 with a positioned power semiconductor chip 22 and an applied connecting element 13. The power semiconductor chip 22 is arranged with its rear side 26, which has for example a drain electrode of a MOSFET or a collector electrode of an IGBT, on a metallic chip carrier 10, the underside of which simultaneously forms an external contact 15 of the power semiconductor device. The top side 25 of the power semiconductor chip 22 is connected to an external contact 15 in the form of a lead 12 by a connecting element 13 in the form of a bonding strip 17, the bonding strip 17 being supported by a plastic film 30. Once such a construction has been completed in a semiconductor device position 19 of the system carrier 20, an adhesion promoting layer can then subsequently be applied.

FIG. 6 illustrates a schematic cross section through the system carrier 20 in accordance with FIG. 5 after the application of an adhesion promoting layer 8. The adhesion promoting layer 8 is once again applied thermally with formation of copper(II)oxide whiskers, as have already been described above. In this case, all freely accessible copper-containing surfaces 6 of the structure illustrated in FIG. 5 are covered with an adhesion promoting layer 8 of this type.

FIG. 7 illustrates a plan view of a system carrier 20 of the power semiconductor device, which, in this embodiment of the invention, has two power semiconductor chips 22 and 32 arranged on separate chip carriers 10. In addition, a signal-processing semiconductor chip 14 is fixed on the top side of the power semiconductor chip 22. For this purpose, the power semiconductor device has leads 12 connected to the power semiconductor chip 22 and 32 and/or the semiconductor chip 14 by bonding strips 17. The supporting film 30 illustrated in FIGS. 5 and 6 is arranged in a manner bearing closely on the power semiconductor chips 22 and 32 and also on the signal-processing semiconductor chip 14 whilst leaving free the contact areas 23 for fitting the bonding strips 17.

The contact areas 23 of the semiconductor chips 14, 22 and 32 and also the contact pads 24 on the leads 12 are marked by dash-dotted lines. The metallically stripped areas which can be seen in FIG. 7 and which belong to the chip carriers 10, the bonding strips 17 and to the leads 12 are copper-containing surfaces 6 and, consequently, after the process of forming copper(II)oxide whiskers that is illustrated in FIG. 6, are covered by a corresponding contact promoting layer and contribute to the presence of an intensive mechanical anchoring between the semiconductor device components 4 and the plastic housing composition (not illustrated here).

FIG. 8 illustrates a schematic cross section through the power semiconductor device 2, in accordance with a second embodiment of the invention. The semiconductor device components 4 illustrated in FIG. 6 are embedded into a plastic housing composition 3, the external contacts 15 on the underside 29 of the power semiconductor device 2 having uncovered external contact areas 31 from which the adhesion promoting layer illustrated in FIG. 6 has been removed.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device comprising:
   a plurality of semiconductor device components embedded in a plastic housing composition, the semiconductor device components including:
      a system carrier including a chip carrier; and
      at least one semiconductor chip arranged on the chip carrier;
      and connecting elements, wherein the semiconductor device components, including the system carrier, the at least one semiconductor chip, and the connecting elements, have copper-containing regions, and wherein only the copper-containing regions have an adhesion promoting layer with copper(II) oxide whiskers on the surfaces that are in contact with the plastic housing composition, wherein the semiconductor chip includes copper-containing interconnects, and wherein the surfaces of said copper-containing interconnects have the adhesion promoting layer and are in contact with the plastic housing composition.

2. The integrated circuit device of claim 1, wherein the copper(II) oxide whiskers are grown thermally.

3. The integrated circuit device of claim 1, wherein the copper(II) oxide whiskers are produced wet-chemically.

4. The integrated circuit device of claim 1, wherein the adhesion promoting layer has copper(II) oxide whiskers having a thickness d of between $1\text{ nm} \leq d \leq 50\text{ nm}$.

5. The integrated circuit device of claim 1, wherein the adhesion promoting layer has copper(II) oxide whiskers having an average length l of between $5\text{ nm} \leq l \leq 300\text{ nm}$.

6. The integrated circuit device of claim 1, wherein the adhesion promoting layer has two layers, wherein the first layer essentially has copper(I) oxide as boundary layer with respect to copper-containing surfaces and a second layer has copper(II) oxide whiskers as boundary layer with respect to the plastic housing composition.

7. The integrated circuit device of claim 1, wherein the adhesion promoting layer undergoes transition from a whisker-free coating on the surfaces of the copper-containing semiconductor device component to a layer containing copper(II) oxide whiskers in the transition region with respect to the plastic housing composition.

8. The integrated circuit device of claim 1, wherein the chip carrier comprises a copper-coated semiconductor chip carrier.

9. The integrated circuit device of claim 1, wherein the semiconductor device components include a copper-containing leadframe with leads and a copper-containing semiconductor chip carrier.

10. The integrated circuit device of claim 1, wherein the semiconductor device components include copper-containing connecting elements extending between the semiconductor chip and external contacts of the integrated circuit device.

11. The integrated circuit device of claim 1, wherein the connecting elements comprise one selected from the group consisting of copper-containing bonding wires, bonding strips and bonding tapes.

12. The integrated circuit device of claim 1, wherein the connecting elements comprise one selected from the group consisting of bonding wires, bonding strips or bonding tapes, each with a copper-containing coating.

13. The integrated circuit device according to claim 1, wherein the semiconductor chip is diffusion-soldered onto the chip carrier.

14. The integrated circuit device of claim 1, wherein the plastic housing composition has an epoxy resin.

15. The integrated circuit device of claim 1, wherein the plastic housing composition has a polyimide plastic.

16. The integrated circuit device of claim 1, wherein the plastic housing composition has a ceramic filling material.

17. The integrated circuit device of claim 1, wherein the plastic housing composition has copper(II) oxide.

18. A system carrier for a plurality of semiconductor devices, comprising:

semiconductor device positions that are arranged in rows and columns and which have a chip carrier and lead ends for the purpose of receiving semiconductor device components, semiconductor chips mounted on the chip carrier at each device position and which are electrically connected to corresponding lead ends by diffusion-soldered or thermo-compression-bonded connecting elements, and wherein only copper-containing regions at the surface of the leadframe, of the connecting elements, and of the semiconductor chips are coated with an adhesion promoting layer with copper(II) oxide whiskers.

19. The system carrier according to claim 18, wherein the adhesion promoting has copper(II) oxide whiskers having a thickness d of between $1\text{ nm} \leq d \leq 50\text{ nm}$.

20. The system carrier according to claim 18, wherein the adhesion promoting has copper(II) oxide whiskers having an average length l of between $5\text{ nm} \leq l \leq 300\text{ nm}$.

21. The system carrier according to claim 18, wherein the adhesion promoting layer has two layers, wherein the first layer has copper(I) oxide as boundary layer with respect to copper-containing surfaces and a second layer has copper(II) oxide whiskers as boundary layer with respect to the plastic housing composition.

22. The system carrier according to claim 18, wherein the adhesion promoting layer undergoes transition from a whisker-free coating on the surfaces of the copper-containing semiconductor device components to a layer containing copper(II) oxide whiskers in the transition region with respect to the plastic housing composition.

23. The system carrier according to claim 18, wherein the system carrier has a plurality of signal-processing logic or memory semiconductor chips on the chip carriers.

24. The system carrier according to claim 18, wherein the system carrier has a plurality of power semiconductor chips on the chip carriers.

25. The system carrier according to claim 18, wherein the semiconductor chip is diffusion-soldered onto the chip carrier.

26. An integrated circuit comprising:
a leadframe including a chip carrier and a plurality of leads, wherein portions of the chip carrier and leads are covered with a copper-containing coating;
a semiconductor chip having a first major surface mounted on the chip carrier and an opposing second major surface having a plurality of copper-containing contact elements and copper-containing interconnects connecting the contact elements to integrated circuitry of the semiconductor chip;
connecting elements having a copper-containing coating connecting the contact elements to the plurality of leads;
an adhesion promoting layer covering only copper containing portions of the leadframe, the connecting elements, and the contact elements and interconnects of the semiconductor chip, the adhesion promoting layer having copper (II) oxide whiskers;
a plastic housing composition embedding the semiconductor chip, the connecting elements, and portions of the leadframe, wherein the copper (II) oxide whiskers of the adhesion promoting layer are in contact with and promote bonding with the plastic housing composition.

* * * * *